(12) United States Patent
Denison et al.

(10) Patent No.: US 7,888,732 B2
(45) Date of Patent: Feb. 15, 2011

(54) LATERAL DRAIN-EXTENDED MOSFET HAVING CHANNEL ALONG SIDEWALL OF DRAIN EXTENSION DIELECTRIC

(75) Inventors: Marie Denison, Plano, TX (US); Taylor Rice Efland, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 477 days.

(21) Appl. No.: 12/101,762

(22) Filed: Apr. 11, 2008

(65) Prior Publication Data

US 2009/0256212 A1    Oct. 15, 2009

(51) Int. Cl.
*H01L 29/66* (2006.01)

(52) U.S. Cl. .................. 257/328; 257/330; 257/331; 257/332; 257/334; 257/408; 257/488; 257/E29.001; 257/E29.118; 257/E21.631; 438/278; 438/316; 438/325; 438/335; 438/400

(58) Field of Classification Search .............. None
See application file for complete search history.

(56) References Cited

U.S. PATENT DOCUMENTS 6,787,848 B2 *    9/2004    Ono et al. ............... 257/328
6,815,293 B2 *    11/2004   Disney et al. ........... 438/268
2004/0173859 A1 *  9/2004   Hao et al. ............... 257/408
2004/0259318 A1 * 12/2004   Williams et al. ......... 438/400

* cited by examiner

*Primary Examiner*—Charles D Garber
*Assistant Examiner*—Yasser A Abdelaziez
(74) *Attorney, Agent, or Firm*—Warren L. Franz; Wade J. Brady, III; Fredrick J. Telecky, Jr.

(57) ABSTRACT

An integrated circuit (200) includes one of more transistors (210) on or in a substrate (10) having semiconductor surface layer, the surface layer having a top surface. At least one of the transistors are drain extended metal-oxide-semiconductor (DEMOS) transistor (210). The DEMOS transistor includes a drift region (14) in the surface layer having a first dopant type, a field dielectric (23) in or on a portion of said surface layer, and a body region of a second dopant type (16) within the drift region (14). The body region (16) has a body wall extending from the top surface of the surface layer downwards along at least a portion of a dielectric wall of an adjacent field dielectric region. A gate dielectric (21) is on at least a portion of the body wall. An electrically conductive gate electrode (22) is on the gate dielectric (21) on the body wall. A source region (18) of the first doping type is in the body region (16), a drain region (20) of the first doping type is in the drift region (14), and interconnects (521) are operable to electrically connect the one or more transistors to each other on the integrated circuit (200).

24 Claims, 13 Drawing Sheets

LATERAL DRAIN-EXTENDED MOSFET HAVING CHANNEL ALONG SIDEWALL OF DRAIN EXTENSION DIELECTRIC

FIELD OF THE INVENTION

The present invention relates to drain-extended MOS field effect transistors and methods for forming the same in which the specific on-resistance and gate-to-drain capacitance of the transistor is reduced.

BACKGROUND

The continual demand to enhanced integrated circuit (IC) performance has resulted in a reduction of semiconductor device geometries, and continual efforts to operate semiconductor devices over a wide range of voltages. A large variety of power semiconductor products in the 20-200V range are fabricated using N or P channel drain-extended field effect and more particularly metal-oxide-semiconductor (DEMOS) transistor devices, or lateral double diffused MOS (LDMOS) devices. These devices are advantageous for System-On-Chip circuit integration using mixed voltages and devices types including, for example, low-voltage MOS devices for digital circuits, memories, bipolar and HVMOS/DEMOS components for analog mixed signal circuits, and LDMOS for power drivers. Frequent fields of application include automotive, consumer, mobile, medical and communication electronics.

Lateral DEMOS and LDMOS present the advantage of having a breakdown voltage which is scalable by drain extension layout, as opposed to vertical or quasi-vertical devices which are optimized for a single drain thickness. DEMOS and LDMOS designs generally require the simultaneous optimization of several electrical parameters. These parameters can include the breakdown voltage (BDV), specific on-resistance (Rsp=on-state resistance in linear regime times device area), switching speed (e.g., as represented by the Rsp*Qgd quality factor, where Qgd is the gate-drain charge), and Safe Operating Area (SOA). Compromises in the value of one or more of these parameters, or to the dimensions of the device, generally need to made in order for the device to work in the SOA that it was intended for.

FIG. 1A is a cross-sectional view of a conventional LDMOS transistor 100, while FIG. 1B is a top view of LDMOS transistor 100 showing alternating n+ source/p+ contacts to the body region along the width of LDMOS transistor 100. An n-type buried layer NBL 11 is formed over p-type substrate 10 having a p-type EPI layer 13 thereon. A counter-doping n-type deep n-well DNWELL region 14 is formed in the p-type epitaxial layer 13, and extends over NBL 11. An n-type well region of higher doping as compared to DNWELL 14 referred to as SNWELL 15 is formed in DNWELL 14 and extends over n-type buried layer 11. The SNWELL 15 is an optional layer in an LDMOS, but can be used as a drain doping buffer improving the device SOA under high gate and drain voltage conditions. A p-type body region 16 is formed in p-epi 13. The DNWELL region 14 overlaps at least a portion of the p-type body region 16. An n+-type source region 18 and a p+ contact region 19 are formed in p-type body region 16. An n+-type drain region 20 which may be of same doping profile as n+-type source region 18 is formed in SNWELL. Although not shown, additional layers of p or n type can be added to the drain extension of LDMOS transistor 100, for example a p-type RESURF (reduced surface field) region connected to body region 16 or floating under portion of the DNWELL 14, or an additional n-type doping buffer towards the drain 20.

A thin gate dielectric layer 21 extends over both a surface portion of p-type body region 16 and the surface of DNWELL region 14. An electrically conductive gate electrode layer 22 extends over gate dielectric layer 21 and the upper portion of a thick field oxide (e.g. a Shallow Trench Isolation (STI) oxide) layer 23 on the side of its source 18. The surface of the p-body region 16 thus provides the channel region for LDMOS transistor 100, which means the channel region is entirely in the horizontal (lateral) direction. A source electrode 24 is in contact with p+-type contact region 19 and n+-type source contact region 18, and a drain electrode 25 is in contact with n+-type drain contact region 20. Gate electrode layer 22, source electrode 24, and drain electrode 25 are generally electrically isolated from one another by an interlayer dielectric (ILD) film (not shown).

The STI oxide 23 (or locally oxidized silicon (LOCOS) in other technologies) is generally necessary to protect the thin gate dielectric edge on the drain side as it would otherwise suffer dielectric breakdown, or progressive degradation during operation. The gate extent (defined herein as the spacing between the output of the channel (the drain end of the p-body 16) and the source side edge of the STI oxide 23) must be large enough to make sure that the LDMOS body-to-drain junction does not block the output of the channel by abutting against the edge of STI 23. The gate extent contributes to the source drain pitch and thus to Rsp. Moreover, this overlap of the gate electrode over the thin gate oxide has a high parasitic gate to drain capacitance which slows down device switching. Finally, the channel itself contributes some pitch length and thus affects RSP somewhat. What is needed is a transistor design wherein the RSP and Qgd are reduced while still providing the required breakdown voltage and SOA.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A method for fabricating a drain extended metal oxide semiconductor (DEMOS) transistor comprises the steps of providing a substrate having a semiconductor surface and a drift region in the surface having a first dopant type. A field dielectric is then formed in or on a portion of the surface. A body region is formed of a second dopant type in the drift region, wherein the body region abuts the field dielectric. A portion of the field dielectric is etched on its side closest to the body region to form an etched region, wherein the etched region exposes at least a wall of the body region that has at least a vertical component. A gate dielectric is formed on at least the wall of the body region. An electrically conductive gate electrode, such as comprising polysilicon, is formed on the gate dielectric on the wall, wherein the gate electrode fills at least a portion of the etched region along the wall of the body region. A source region is formed in the body region and a drain region is formed in the drift region, both doped with the first doping type.

An integrated circuit includes one of more transistors on or in a substrate having semiconductor surface layer, the surface layer having a top surface. At least one of the transistors are drain extended metal-oxide-semiconductor (DEMOS) transistor. The DEMOS transistor include a drift region in the surface layer having a first dopant type, a field dielectric in or on a portion of the surface layer, and a body region of a second dopant type overlapping or within the drift region. The body region has a body wall extending from the top surface of the surface semiconductor layer downwards along at least a portion of a dielectric wall of an adjacent field dielectric region. A gate dielectric is on at least a portion of the body wall. An electrically conductive gate electrode is on the gate dielectric on the body wall. A source region of the first doping type is in the body region, a drain region of the first doping type in the drift region, and interconnects are operable to electrically connect the one or more transistors to each other on the integrated circuit.

DESCRIPTION OF THE DRAWINGS

FIG. 1A is a cross-sectional view of a conventional DEMOS transistor, while

DETAILED DESCRIPTION

Figure 1A:
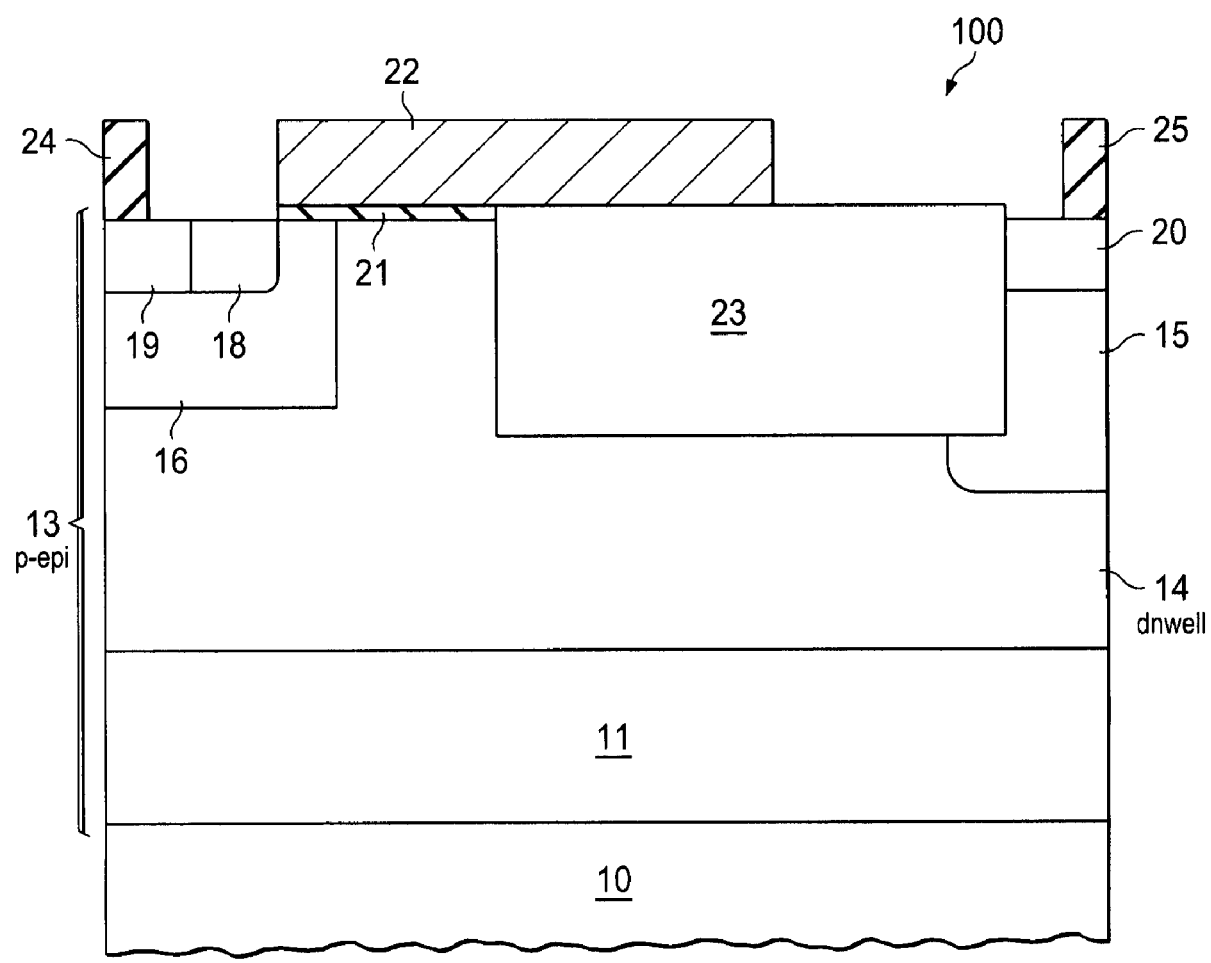

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure benefits from the Inventor's recognition that improvements in one or all of BV, Rsp, Rsp*Qgd (quality factor) and SOA can be obtained folding the channel, gate extent and the gate, and optionally other field plate electrodes into the depth of the thick lateral field dielectric layer (e.g., shallow trench or field oxide isolation structures) which extends over the drain extension of the device. This can be achieved by etching an opening into the thick dielectric on its source side, growing or depositing a gate dielectric, and filling the etched region with an electrically conductive material (e.g. doped polysilicon) to form a gate electrode. For a given BV requirement this generally results in (i) a reduction of Rsp through a reduction of the source-drain pitch, (ii) a reduction of Rsp and an improvement in lifetime SOA under hot carrier stress through the suppression of the drain region bottleneck between the output of the channel and the drain extension, and (iii) in a reduction of the switching time through a reduced gate-drain parasitic capacitance. One or more field plates not necessarily connected to the gate electrode can be implemented into the thick isolation dielectric using the same process to modify the voltage drop across the drain extension, the breakdown voltage/static, dynamic and lifetime SOA.

In many DEMOS devices, such as the conventional LDMOS transistor 100 shown in FIGS. 1A and B, the gate extent has to be made large because if the p-type body region 16 which functions as a backgate well is too close to the STI sidewall (or birds beak in the case of LOCOS), there is a DNWELL bottleneck between the output of the channel and the drain extension bottleneck, defined by the source side sidewall of the field dielectric 23, such as STI or LOCOS birds beak, and by the backgate well 16. This bottleneck can be a problem because at high gate/drain voltage there is a high current density traversing a region of high electric field close to the gate, so that a high density of hot carriers can be injected into the gate dielectric 21 (e.g. gate oxide) which can produce a significant drift in the electrical characteristics of the transistor 100. For devices according to embodiments of the invention, as described below, there is no such bottleneck, since the current flows from the channel directly into the thick drain extension.

Figure 2A:
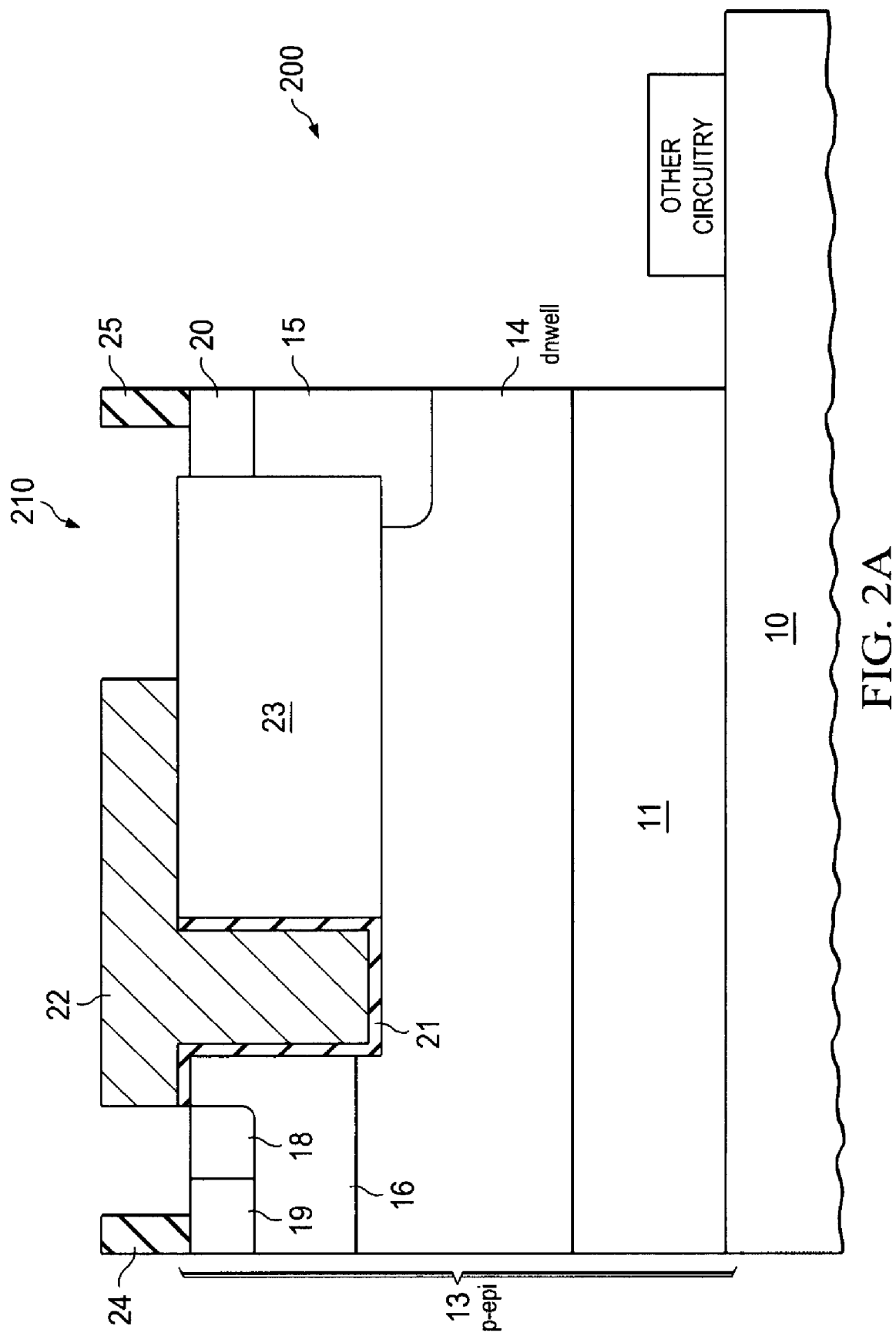
FIG. 2A is a cross-sectional view of an integrated circuit including a DEMOS transistor according to an embodiment of the invention which includes a horizontal and vertical channel portion.

FIG. 2A is a cross-sectional view of an integrated circuit 200 comprising a high voltage DEMOS transistor 210 according to an embodiment of the invention which includes both a horizontal and a vertical channel portion. The vertical channel portion is formed along the silicon interface to a thin gate dielectric sidewall. Electrically conductive gate electrode (e.g. polysilicon) is shown as 22 and thin gate dielectric layer as 21. Field dielectric 23 (e.g. STI dielectric layer or other thick dielectric layer) generally has thickness of <0.5 microns, such as 0.25 to 0.45 microns. However, field dielectric 23 can be deeper than 0.5 microns. Compared to conventional LDMOS transistor 100 shown in FIG. 1A it can be seen that for transistor 210 the portion of the field dielectric layer 23 closest to the source 18 has been removed (e.g. by an anisotropic etch as evidenced by the vertical dielectric wall shown) and is shown lined with thin gate dielectric layer 21 having gate conductive layer (e.g. polysilicon) 22 thereon. Thin gate insulating layer 21 extends horizontally over the surface of p-type body region 16, vertically along a sidewall of p-type body region 16 and DNWELL 14, then horizontally along DNWELL 14, and vertically along field dielectric 23 if the gate insulating layer is deposited (as opposed to being thermally grown). In some embodiments, the thin gate dielectric layer 21 comprises a silicon oxide layer having thickness ranging in thickness from about 2 nm to 100 nm.

Gate electrode layer 22 also extends over a portion of field dielectric layer 23 where it acts as a field plate over the drain extension. In addition, the drain end of p-type body region 16 now abuts what had been the edge of the field dielectric layer 23 prior to its etch. The p-type body region 16 is shown being shallower than field dielectric 23, although this is not required. The gate electrode layer 21 overlaps over the silicon surface (referred to herein as MOAT) and over a surface portion of p-type body region 16 which can be varied to vary the channel length of the device as in conventional DEMOS designs. The overlap of the gate electrode 22 over DNWELL 14 is substantially less than the overlap shown for conventional transistor 100 in FIG. 1A, its minimum size generally being limited by the gate electrode thickness in the technology in use generally if the trench is made about twice as large as the gate electrode thickness to fill it with a planar gate surface for optimum depth of focus and lithography control. For example, in one embodiment the gate electrode 22 overlap over DNWELL 14 can be <0.6 µm, opposed to 2 µm or more for conventional transistor 100. This aspect of the invention not only reduces the source-drain pitch e.g. Rsp but also significantly reduces the gate to body capacitance. Moreover, by having p-type body region 16 abutting what had been the edge of the field dielectric layer 23 prior to its etch transistor 210 eliminates the DNWELL bottleneck causing increased Rsp and hot carrier driven parameter drift during operation as described relative to conventional transistor 100 shown in FIG. 1A.

Figure 2B:
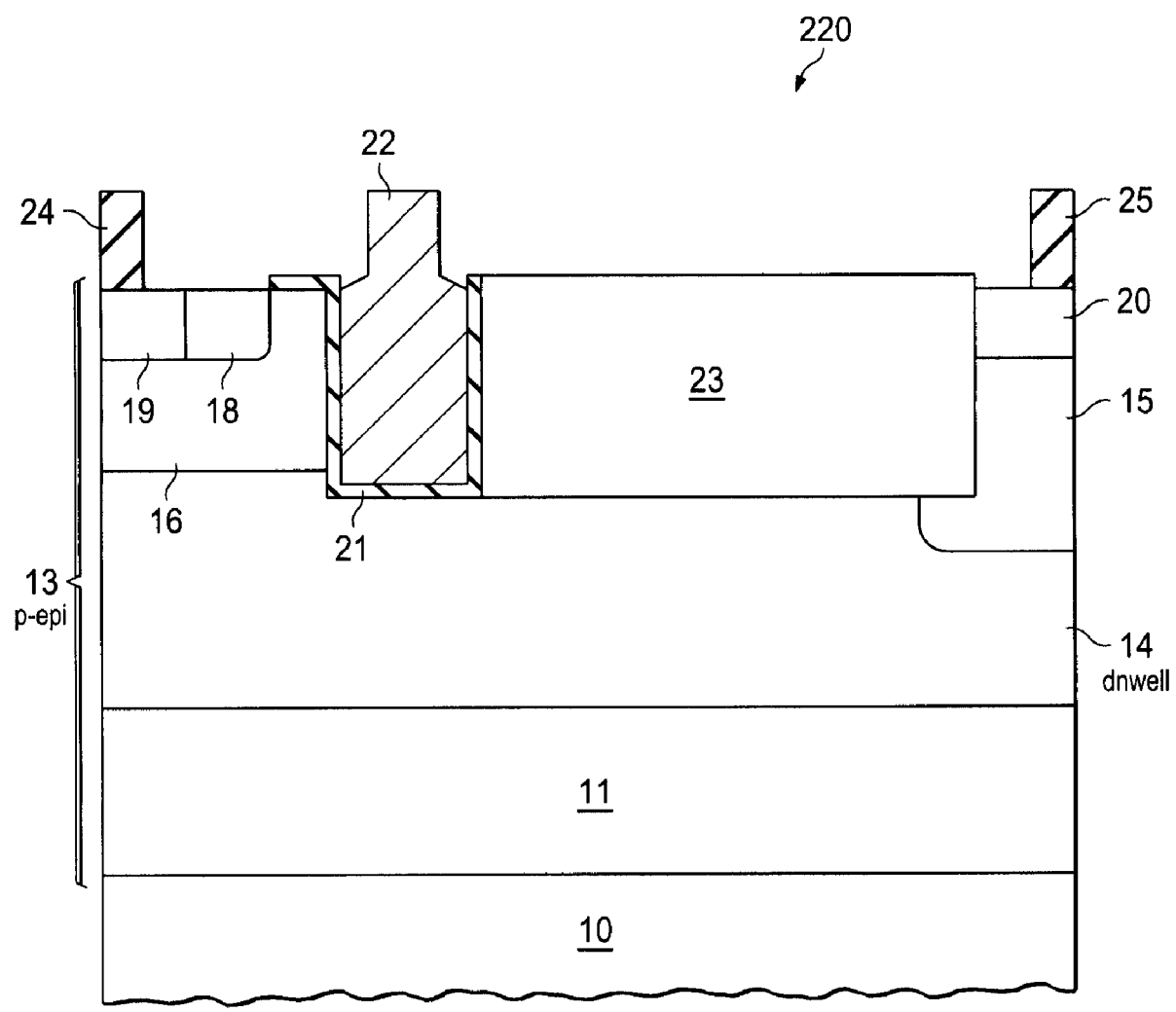
FIG. 2B is a cross-sectional view of a DEMOS transistor according to an embodiment of the invention which includes the n+ source abutting the vertical channel and the gate electrode layer (e.g. poly) etched inside of the etched region of the field dielectric.

FIG. 2B is a cross-sectional view of a DEMOS transistor 220 according to an embodiment of the invention which includes the n+ source 18 abutting what had been the edge of the field dielectric layer 23 at the surface, and gate electrode layer 22 (e.g. poly) etched inside the etched region of the field dielectric 23. Regarding the channel, the gate electrode layer 22 also overlaps the MOAT/p-type body region 16 by a minimum amount so that the n+ source 18 now abuts what had been the edge of the field dielectric layer 23 at the surface, while the p-type body region 16 abuts what had been the edge of the field dielectric layer 23 below the n+ source 18. Regarding the offset of the gate electrode 22, the offset shown can be formed using a dielectric etch stop, and a slight gate electrode (e.g. poly) overetch into trench. Thus, the gate electrode layer 22 is etched slightly inside of the etched region so that it is offset from the edge of the etched region of the field dielectric. This offset can also be essentially equal to zero when the gate electrode edge is aligned to the trench edge.

Figure 2C:
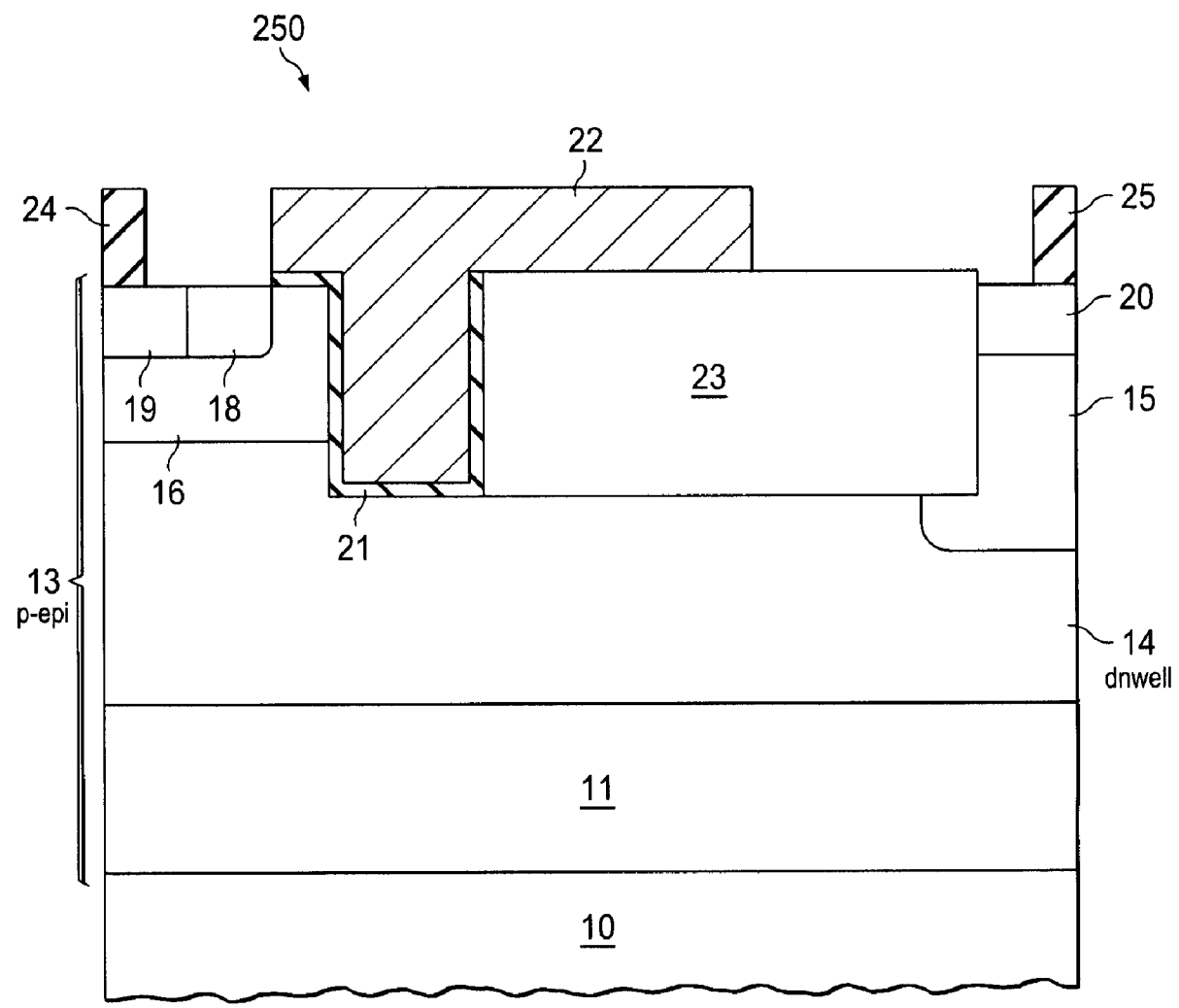
FIG. 2C is a cross-sectional view of a high voltage DEMOS transistor according to an embodiment of the invention in which the n+ source abuts the channel and the body to drain junction is shallower than the bottom of the field dielectric.

FIG. 2C is a cross-sectional view of an DEMOS transistor 250 according to another embodiment of the invention having a channel region analogous to DEMOS transistor 220. As with DEMOS 220, for DEMOS 250 the gate electrode layer 22 overlaps the MOAT/p-type body region 16 by a minimum amount so that the n+ source 17 now abuts what had been the edge of the field dielectric layer 23 at the surface, while the p-type body region 16 abuts what had been the edge of the field dielectric layer 23 below the n+ source 17. Thin gate dielectric layer 21 extends along a sidewall of n+ source 17 and p-type body region 16 on the source side wall. Thus, transistors 220 and 250 eliminate the surface gate extent (defined as the overlap of the gate electrode 22 over the drain DNWELL 14 shown and described relative to conventional transistor 100 shown in FIG. 1A as well as the horizontal channel portion provided by transistor 210 shown in FIG. 2A. This configuration is applicable and advantageous for low voltage DEMOS (e.g. 20-40V), where the body 16 dose and with it the body to drain junction depth can be shallower than the depth of the field dielectric 23 so that there is only a short vertical channel and so that the edges of the body implant mask can be placed away from the MOAT edges without misalignment issues since the implant is self aligned with the MOAT.

Figure 2D:
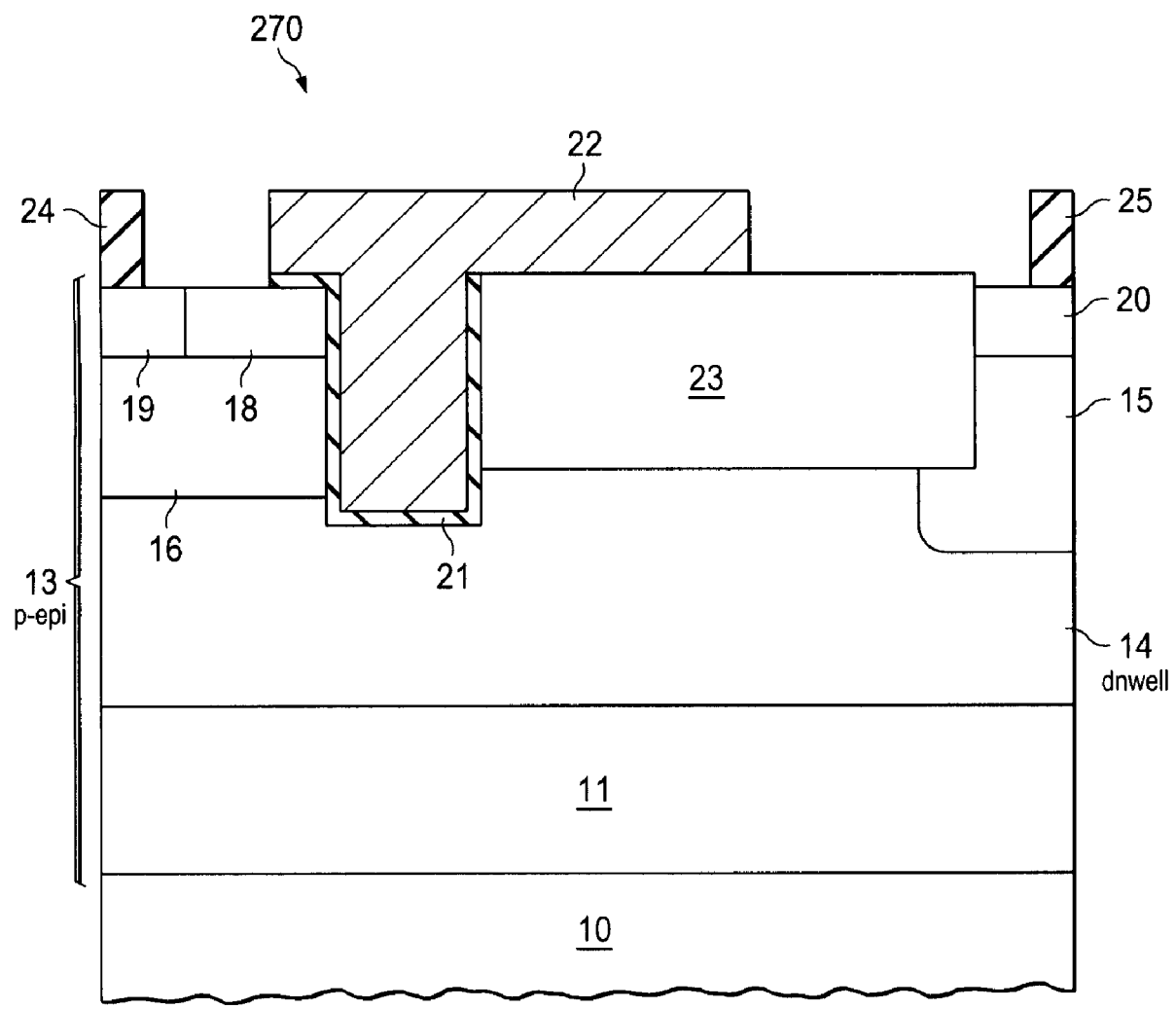
FIG. 2D is a cross-sectional view of a DEMOS transistor according to yet another embodiment of the invention where the gate trench has been etched anisotropically into both field dielectric and semiconductor material.

FIG. 2D is a cross-sectional view of a DEMOS transistor 270 according to another embodiment of the invention that is generally analogous to transistor 250 in that n+ source 17 abuts the vertical portion of thin gate dielectric layer 21. Thus, like transistors 220 and 250, transistor 270 also eliminates the horizontal channel portion of transistor 210. However, in contrast to transistors 220 and 250, transistor 270 adds a channel portion formed into the silicon at a depth below the thick dielectric region 22, such as by adding an anisotropic etch into the silicon below field dielectric 23.

Figure 2E:
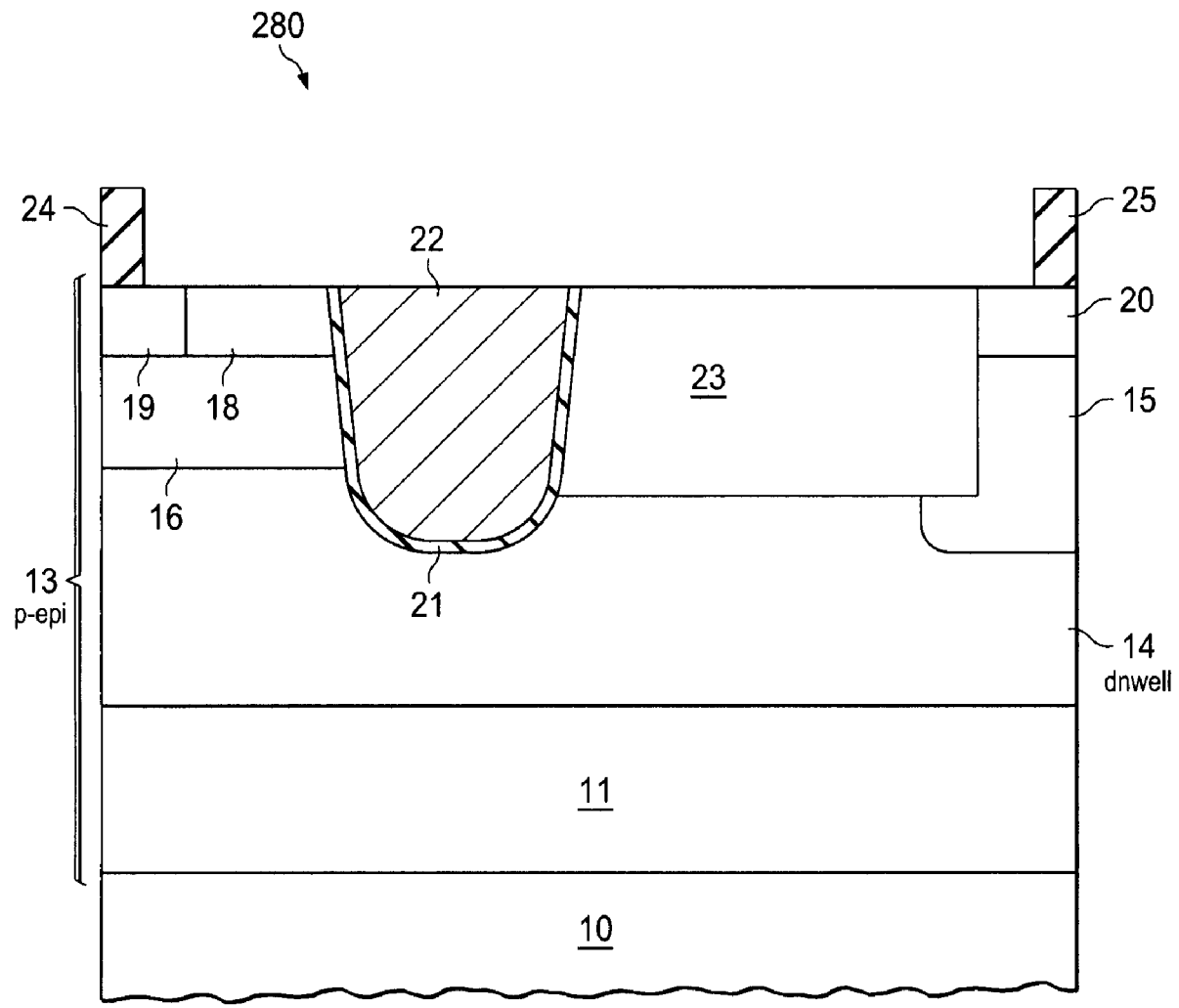
FIG. 2E is a cross-sectional view of a DEMOS transistor according to yet another embodiment of the invention where the gate trench has been etched isotropically into both field dielectric and semiconductor material, and that provides a gate electrode layer that is planarized with the surface of the field dielectric.

FIG. 2E is a cross-sectional view of a high voltage DEMOS transistor 280 according to yet another embodiment of the invention that is generally analogous to transistor 270 shown in FIG. 2C in that source 17 abuts the vertical portion of thin gate dielectric layer 21 and thin gate dielectric extends into the silicon below the field dielectric 23. However, the etched region in field dielectric 23 is tapered (rounded), as opposed to the near vertical walls resulting from anisotropic etch as shown and described relative to FIGS. 2A-C. The tapered trench provides smoother trench edges and generally better electric field distribution as compared to the comparatively sharp anisotropically etched trench edges that occur at corners. Moreover, the gate electrode layer 22 is now shown planarized with the surface of the thick field dielectric 23 and source 17.

A planarized gate layer, such as shown in FIG. 2E can be advantageous in case the length of the trench in the field dielectric 23 is desired to be different from the double standard gate poly thickness. The gate electrode 22 (e.g. poly) can, for example, be etched back or polished by Chemical Mechanical Polishing (CMP).

Figure 2F:
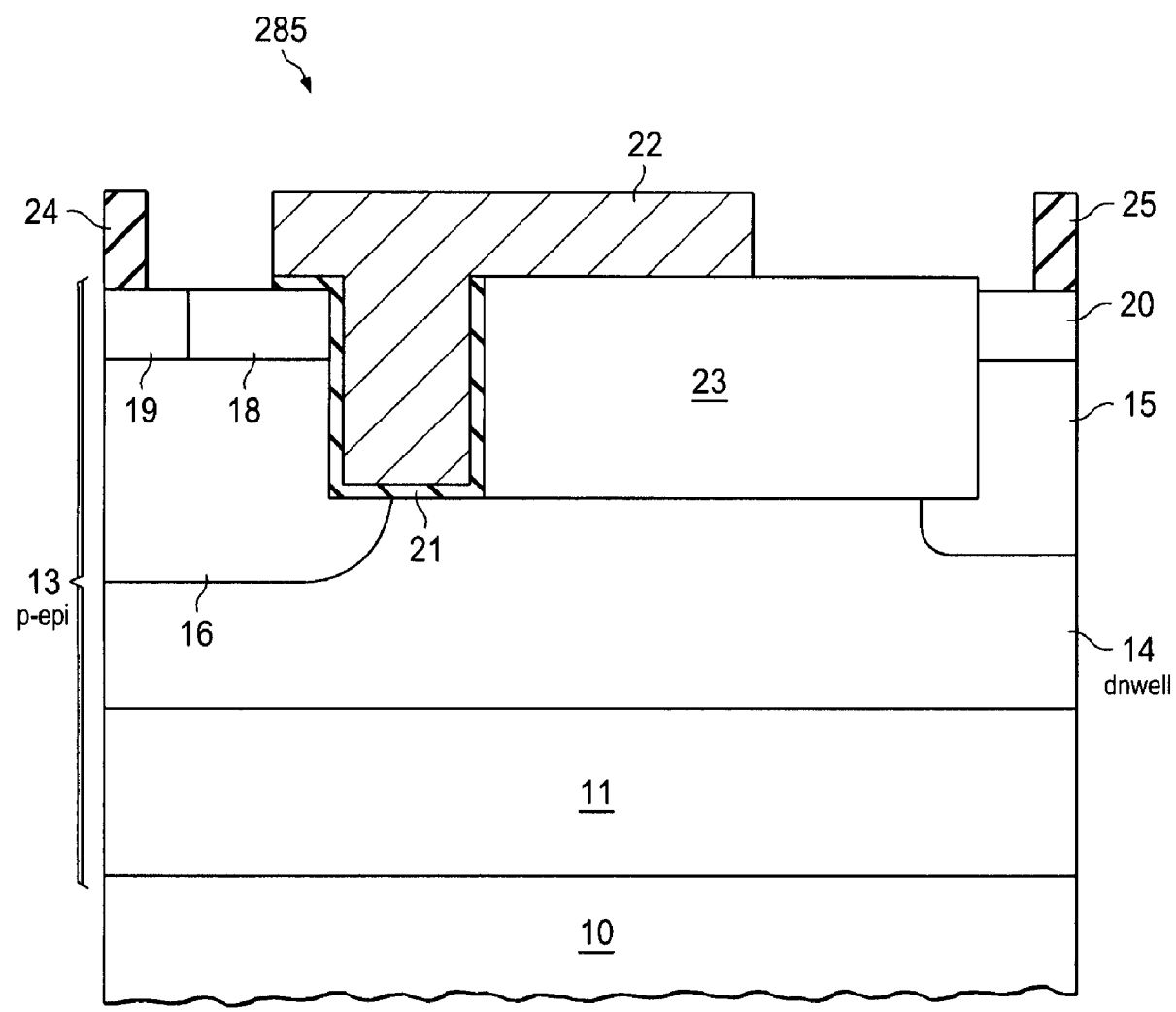
FIG. 2F is a cross-sectional view of a DEMOS transistor according to another embodiment of the invention which has a vertical channel portion and a sub-surface bottom channel portion formed along the bottom of the etched-out field dielectric region.

FIG. 2F is a cross-sectional view of a DEMOS transistor 285 according to yet another embodiment of the invention. P-body region 16 is deeper as compared to the depth of field dielectric 23, for example because of lateral out diffusion or because of body implantation through the field dielectric 23. There is also a horizontal channel component shown (gate electrode 22 over thin gate dielectric layer 21) at the bottom of the field dielectric 23.

Figure 2G:
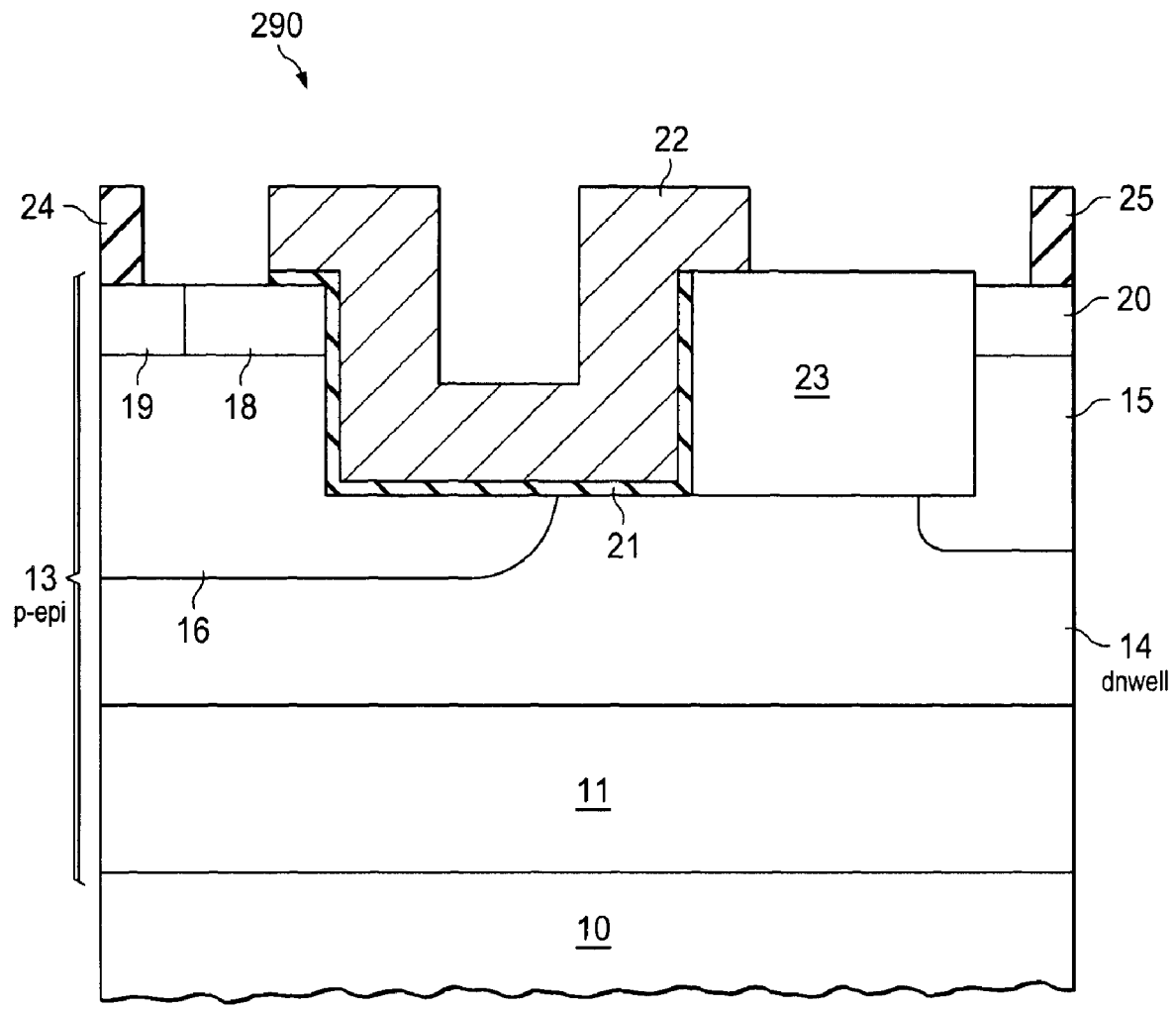
FIG. 2G is a cross-sectional view of a DEMOS transistor according to yet another embodiment of the invention where the gate electrode surface is not planar.

FIG. 2G is a cross-sectional view of a DEMOS transistor 290 according to yet another embodiment of the invention. As with DEMOS 285 shown in FIG. 2F, P-body region is deeper as compared to the depth of field dielectric 23. The gate electrode layer 22 (e.g. poly) shows the gate electrode dipping into the etched out field dielectric region. This topography may result in somewhat inaccurate lithography on the gate electrode in relation with the depth of focus setting. However, this may be acceptable depending on the degree of miniaturization required.

Figure 2H:
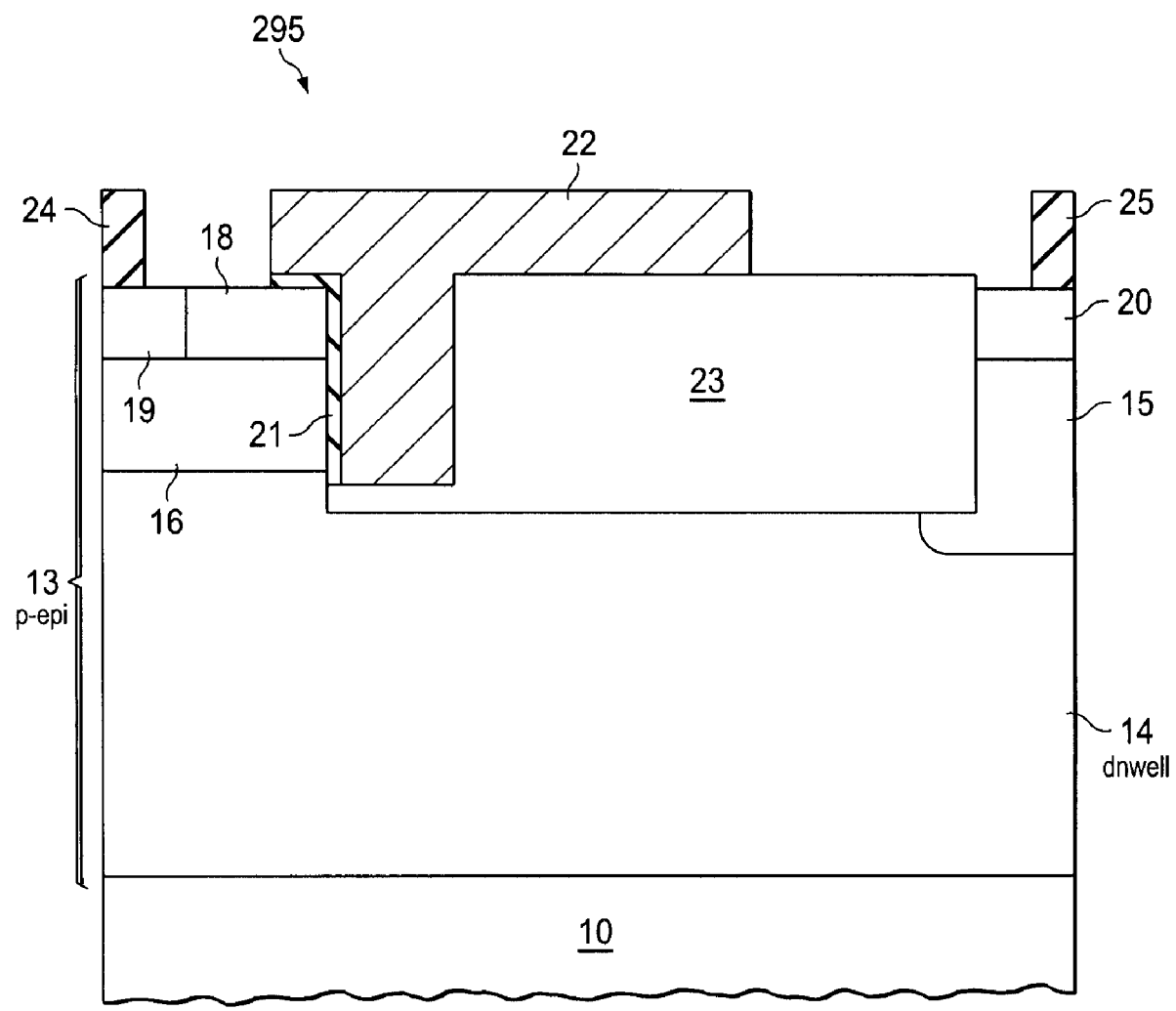
FIG. 2H is a cross-sectional view of a DEMOS transistor according to another embodiment of the invention where the field dielectric etch does not reach the interface to the semiconductor material.

FIG. 2H is a cross-sectional view of a DEMOS transistor 295 according to yet another embodiment of the invention. Part of the field dielectric layer 23 remains at the bottom of etched out field dielectric region. Thus, gate dielectric 21 is along the vertical wall but not the bottom wall of the etched field dielectric. This structure can be formed by using an incomplete STI etch. An advantage of transistor 295 is that the thin gate dielectric 21 is not exposed to high electric fields, so that the drift region can be designed more aggressively. A further advantage in the case of a deep oxide at the bottom of a deep etched region is a folding of the drain extension into the depth of the semiconductor, allowing to reduce the source-drain pitch and thus the device Rsp. The dielectric thickness at the field dielectric 23 under the gate dielectric 22 generally can be from 20 nm to a few 100 nm, or even in the µm range.

The embodiments described above can be realized, for example, by depositing and structuring a hard mask such as silicon nitride or photo resist over the field dielectric 23, such as an STI oxide, etching the field dielectric 23 on a length about twice the thickness of the gate electrode layer 22 (e.g. polysilicon), growing or depositing a gate dielectric 21 (e.g. oxide), depositing a gate electrode layer such as a polysilicon layer (which generally completely fills the trench because of the chosen sizing of the latter), depositing a mask and structuring the gate electrode (e.g. poly) using standard lithography techniques. In such implementation, the width of the gate electrode 22 within the field dielectric 23 is thus determined by the thickness of the gate electrode material.

In one embodiment, a lightly doped drain (LDD) implant is used as source 18 abutting the gate dielectric. Such a structure can improve the source/drain punchthrough voltage in the channel area by increasing the body dose between the NLDD source and DNWELL drain, particularly when using a relatively shallow (e.g. <0.40 µm deep) field dielectric 23 (e.g. shallow STI or body well. If silicidation is used, the LDD should generally be masked against silicidation since the silicide process consumes a depth of surface silicon that can completely consume the LDD. The body doping profile can be designed to have a larger depth in its center under the contacts over deeper n+ source region 18.

Figure 1B:
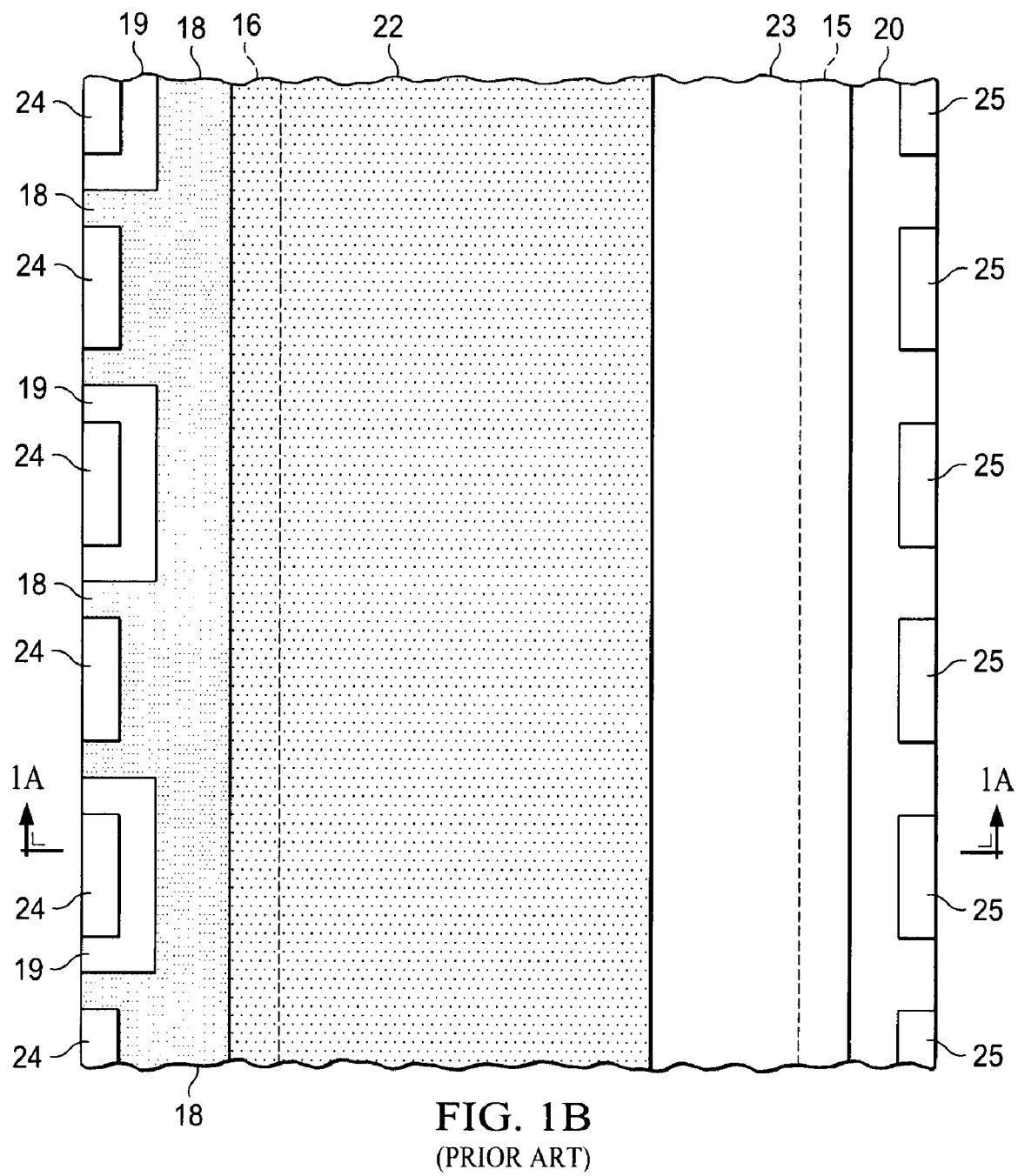
FIG. 1B is a top view of the conventional high voltage DEMOS transistor showing alternating n+/p+ contacts in the body region along the width of the transistor.

Although not described above relative to FIGS. 2A-H, DEMOS transistors according to the invention can utilize alternating n+/p+ contacts in the body region 16 along the width of the transistor, such as shown in FIG. 1B. Alternatively, for DEMOS transistors having separate backgate and source terminals, the n+ and p+ regions can be formed as separate stripes along the width, for example separated by a field dielectric (e.g. STI oxide) stripe and connected to separate metal lines.

For high voltage applications one or more additional field plates may be used, in trench or over the field oxide. The field plates can be on the source and/or the drain side of the transistor. In such cases, other electrode layers may be used in the process (gate electrode of low voltage MOS transistors, poly resistor, poly/poly capacitor . . . ) which can be placed over the field dielectric 23, in an example somewhat apart from the trench gate region to avoid etching it away during structuring of the surface field plate. Overlap over the trench gate region is possible depending on the etch and etch stop methods used. Embodiments of the invention can comprise thick dielectric isolation comprising one or more thick dielectric portions along the length of transistors according to the invention (with preferably a thicker field oxide thickness on the drain side).

Figure 3:
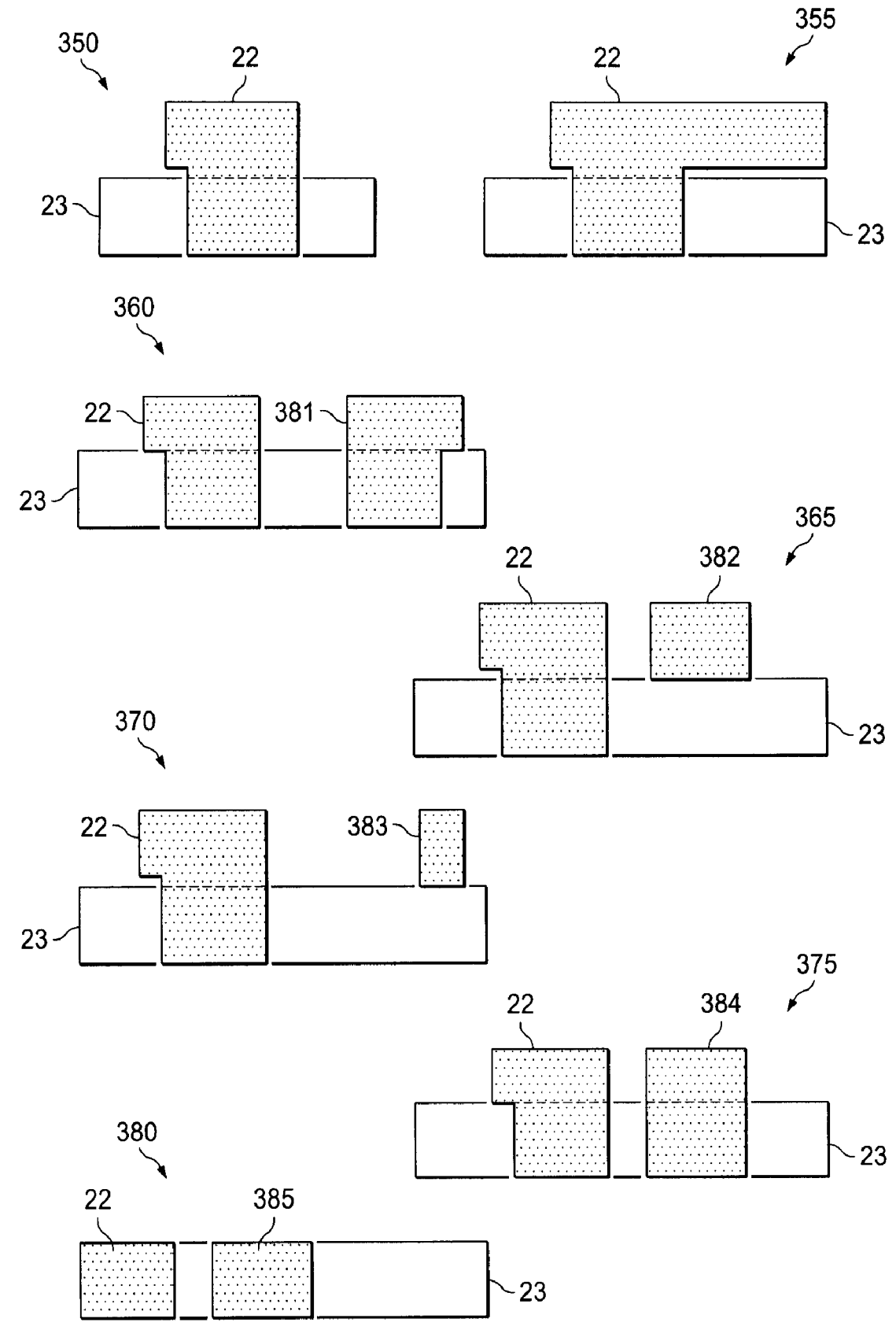
FIG. 3 shows seven (7) simplified exemplary field plate arrangements, according to various embodiments of the invention.

FIG. 3 shows seven (7) simplified exemplary field plate arrangements, according to embodiments of the invention. In each arrangement, the gate electrode is shown as 22, and the field dielectric as 23. In arrangement 350, the gate electrode plate 22 is the only field plate, and this plate does not overlap the field dielectric 23. In arrangement 355, the gate electrode plate 22 is the only field plate, and the plate does overlap the field dielectric 23. In arrangement 360, another plate 381 is formed into the field dielectric 23, and is shown being connected to the drain voltage (e.g. by a metal interconnect). In arrangement 365, another plate 382 is formed on the field dielectric 23, and can be connected to the gate, source or any other independent terminal (e.g. by a metal interconnect). In arrangement 370, another plate 383 is formed on the field dielectric 23, and is shown being connected to the drain voltage. In arrangement 375, another plate 384 is formed into the field dielectric 23, and is shown unconnected (floating). For multiple dielectric stripe embodiments as described below in relation to FIG. 4, the arrangements shown can be used for each dielectric stripe. Arrangement 380 is analogous to arrangement 375, except now the gate electrode layer (e.g. poly) is planarized with the field dielectric surface 23.

Figure 4:
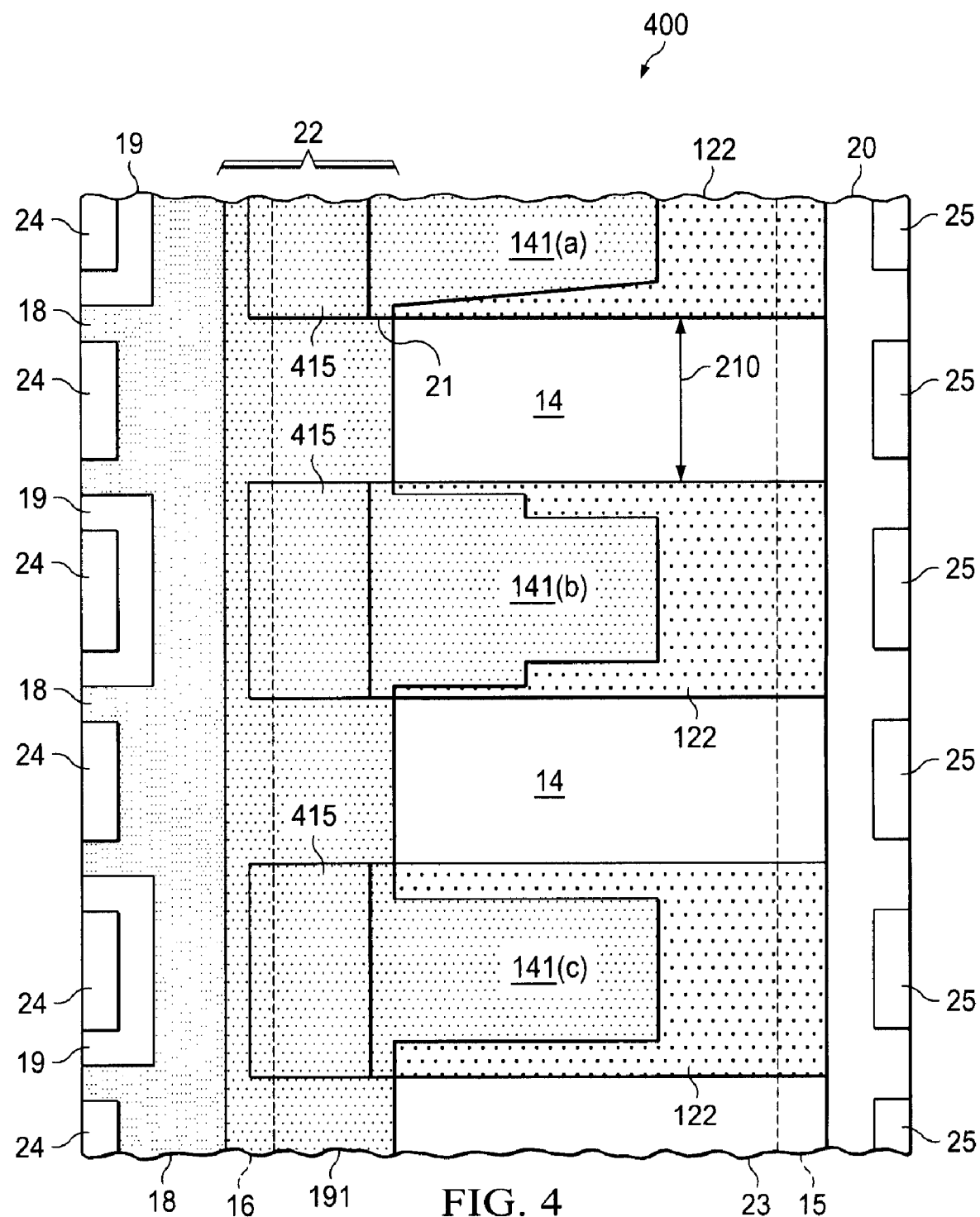
FIG. 4 is a top view of a high voltage DEMOS transistor according to yet another embodiment of the invention, comprising a plurality of dielectric stripes that are separated from each other and that extend across at least a portion of the length between the source and drain region, the stripes having a gate electrode thereon and gate trench therein.

FIG. 4 is a top view of a high voltage DEMOS transistor 400 according to yet another embodiment of the invention, comprising a plurality of dielectric stripes 122 each having a gate trench region 415 that is filled with gate electrode layer 22 on gate dielectric 21, that are separated from each other across at least a portion of the length between the source and drain region. The region shown as p-body 16 has an overlapping gate electrode layer (e.g. poly) 22 thereon. Reference 191 is shown to represent the edge of the mask for p-body 16. There is a gap 210 between individual dielectric stripes 122 that are adjacent to each other. Although the dielectric stripes 122 are shown completely separated in FIG. 4, they may also be connected at their source or drain ends, or at both ends. Gate electrode layer 22 includes extension regions 141(a), 141(b) and 141(c). As implementation examples, extension region 141(a) has a sloped/tapered gate electrode (e.g. poly) width, region 141(b) stepped gate electrode width, while region 141(c) has a single gate electrode width.

Embodiments of the invention include configuring the field dielectric isolation and the electrically conductive plate structure of a semiconductor device to have portions that lay on, and overlap with, portions of a thick dielectric region, such as dielectric stripes 122 shown in FIG. 4 or more generally field dielectric 23 (e.g., shallow trench or field dielectric isolation structures) of the device, to provide improvements in one or all of BDV, Rsp, and Rsp*Qgd quality factor. These configurations permit a greater degree of drain extension depletion than previously recognized mainly due to dielectric depletion and field plate effect along the width. That is, the shape, dimensions, degree of overlap and spacing of the conductive bands and insulating stripes are newly recognized result-effective variables that can be used to control the BDV, Rsp, Rsp*Qgd quality, and other properties of the semiconductor device.

Furthermore, as shown in FIG. 4, the gate trench 415 in the dielectric fingers 122 abut against the body well of which the out diffusion extends along the sidewalls of the dielectric fingers 122 along the source-drain axis, so that there is an additional channel region along the sidewalls of the gate trenches in the source-drain direction. Therefore, the channel is "folded" into the depth of the semiconductor and the effective width of the device is increased (Rsp is thus decreased). The channel for DEMOS transistor 400 thus comprise three (3) components:
(i) a vertical channel portion as is shown in the embodiments of FIGS. 2A-H),
(ii) a channel portion along the sidewalls of the gate trenches 415 parallel to the source drain axis (length of the device 400), and
(iii) an additional lateral surface channel portion under the parts of the planar gate electrode 22 located between the dielectric stripes 122 of the field dielectric (e.g. STI fingers).

In some embodiments of the invention, the length between source 18 and drain 20 ranges from about 1 to 10 µm. In some cases the stripes 122 extend across this entire length and contact the source region 18. In other cases the stripes 122 can partially extend across the length between the source and drain regions 18 and 20. As described above, in other cases, the dielectric stripes 122 can be connected on the source or drain side, or along both sides. In some transistors according to embodiments of the invention, the gap 210 between adjacent stripes 122 can range from about 50 nm to 1 µm. In some embodiments, the stripes 122 can be connected with one another, for example along the source or drain side, for the purpose of electric field optimization along the drain extension.

Processing to form DEMOS devices according to the invention can comprise providing a substrate having a semiconductor surface, forming one or more optional buried layers and epitaxial layers, and a drift region in the surface having a first dopant type. A thick field dielectric isolation layer is formed in or on a portion of the surface, such as STI oxide or LOCOS. In one embodiment, the field dielectric is formed in a plurality of spaced apart dielectric stripes, such as shown in FIG. 4. A body region of a second dopant type is formed in the drift region, wherein the body region abuts the field dielectric. The mask for the body region implant extends over the field dielectric isolation. At least a portion of the field dielectric on its side closest to the body region is then etched to form an etched region, wherein the etched region exposes at least a body wall of the body region that is generally a vertical wall. The etch can be an anisotropic (e.g. RIE) etch or an isotropic (e.g. wet) etch, or a combination of both. The thick field dielectric can be etched down to the underlying silicon as an etch stop. Silicon below the field dielectric may also be etched with a resulting structure such as transistor 270 shown in FIG. 2D. In the case of a silicon surface layer, the field dielectric etch is generally an etch that has a high selectivity to silicon. The length of the etched region (length measured from source to drain) can be set for pinch-off of the later deposited gate electrode layer (e.g. polysilicon) to provide improved depth of focus for the lithography and etch of the later deposited gate electrode layer (e.g. polysilicon). An etch region length that is 1.5 to 2.5× the deposition layer thickness, such as about 2×, can be used to generally provide pinch-off of the deposited layer.

Following etch of the etched region, a sacrificial gate oxide may be grown and then stripped to remove defects and provide some stress relief. A gate dielectric is then formed, either by growing or depositing, on at least the wall of the body region. A first electrically conductive gate electrode layer is then formed on the gate dielectric and on the wall, wherein the gate electrode fills the etched region and extends over a portion of the field dielectric. The gate electrode layer can be optionally planarized. In one embodiment the gate electrode includes a plurality of electrode fingers extending over field dielectric stripes (see FIG. 4). However, electrodes on the field dielectric stripes can also include plates (e.g. formed from a second polysilicon deposition) isolated from the gate electrode or other layers, such as shown in FIG. 3. A source region of the first doping type is formed in the body region, if it has not been implanted with the body region earlier in the process flow. Otherwise, the source region can be self aligned by the gate electrode layer edge on the silicon surface. Contact implants are formed in the body and drain regions, and usual back end of line processing is used to form conductive via and metal layers and inter-layer dielectrics.

Transistors according to the invention are particularly useful as medium to high voltage devices on high power or high voltage integrated circuits, such as in a range from 10 to 200V operating voltage. Transistors according to the invention can be used in various applications like for example high-voltage switches, motor drivers, voltage or current regulators, boost converters or power MOSFET gate drivers.

Figure 5:
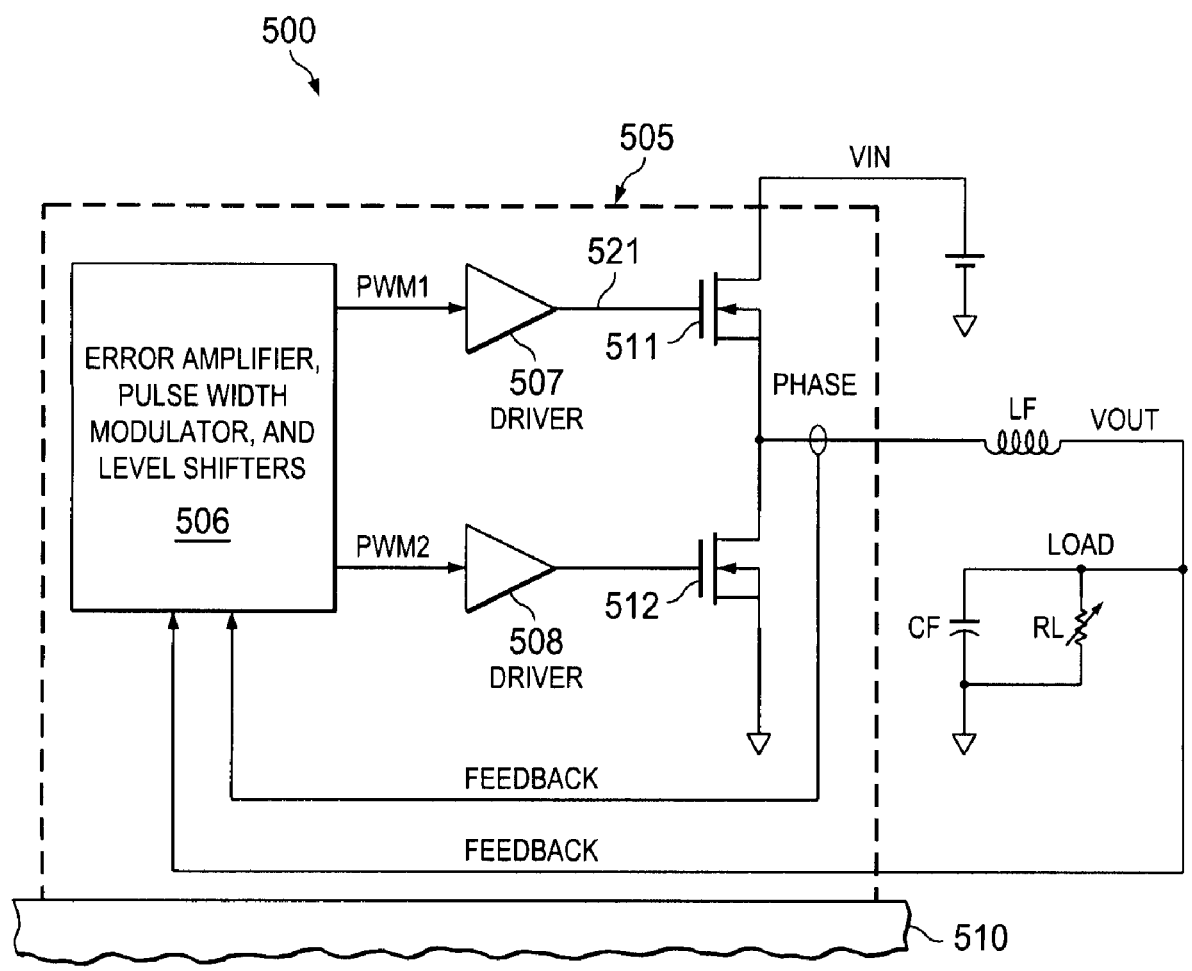
FIG. 5 shows a simplified depiction of a synchronous PWM switching regulator comprising an integrated circuit (IC) to which one of more transistors according to the invention can be included.

For example, FIG. 5 shows a simplified depiction of a synchronous pulse width modulation (PWM) switching voltage regulator 500 comprising an integrated circuit (IC) 505 to which one of more DEMOS transistors according to the invention can be included, such as the transistors shown in FIGS. 2A-H. The IC 505 is formed on a substrate having a semiconductor surface layer 510. As known in the art, block 506 represents a controller comprising an error amplifier which has an output which coupled to a pulse width modulator (PWM), the PWM being coupled to level shifters. Controller outputs PWM1 and PWM2 signals which are coupled to inputs of power drivers 507 and 508, respectively. Power drivers 507 and 508 drive output power switches 511 and 512, respectively. Connections between the blocks and devices are provided by interconnect 521, such as by metallization. Power switches 511 and 512 receive a voltage VIN and drive an external load RL (e.g. a microprocessor) coupled to node VOUT via the low pass network comprising inductor LF in series with capacitor CF shown. Transistors according to the invention can be used for drivers 507 and 508 and/or output power switches 511 and 512. Stand alone integrated power driver ICs, power switch ICs, as well as power driver and power switch comprising ICs may also be provided.

Although the exemplary devices described above are configured as n-type MOS transistors, the invention also includes devices that are configured as p-type MOS transistors or combinations of n-type or p-type transistors. One of ordinary skill in the art would understand how to fabricate p-type transistors in accordance with the invention, e.g., by inverting the type of dopants, as compared to that shown in the figures.

The semiconductor substrates may include various elements therein and/or layers thereon. These can include barrier layers, other dielectric layers, device structures, active elements and passive elements including, source regions, drain regions, bit lines, bases, emitters, collectors, conductive lines, conductive vias, etc. Moreover, the invention can be based on a variety of processes including CMOS, BiCMOS and BCD (Bipolar-CMOS-DMOS) technologies.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. An integrated circuit including at least one drain extended metal oxide semiconductor (DEMOS) transistor, comprising:
    a drift region in a surface layer having a first dopant type;
    a field dielectric in or on a portion of the surface layer;
    a body region of a second dopant type within the drift region, the body region having a body wall extending from a top surface of the surface layer downwards along at least a portion of a dielectric wall of the field dielectric region;
    a gate dielectric on at least a portion of the body wall;
    a gate electrode on the gate dielectric on the body wall;
    a source region of the first doping in the body region; and
    a drain region of the first doping type in the drift region.

2. The integrated circuit of claim 1, wherein the gate electrode comprises polysilicon and extends over a portion of the field dielectric.

3. The integrated circuit of claim 1, wherein the gate electrode is planar with a top surface of the field dielectric, and wherein the first gate electrode does not extend over the top surface of the field dielectric.

4. The integrated circuit of claim 1, wherein the source region comprises a lightly doped drain (LDD) doped source region.

5. The integrated circuit of claim 1, wherein the source region abuts the body wall.

6. The integrated circuit of claim 1, wherein a depth of the body region is less than a depth of the field dielectric.

7. The integrated circuit of claim 1, wherein a bottom portion of the body wall extends below a depth of said field dielectric.

8. The integrated circuit of claim 1, wherein the field dielectric includes a thinned field dielectric portion beneath a portion of the gate electrode.

9. The integrated circuit of claim 1 wherein the field dielectric comprises a plurality of field dielectric portions that are separated from each other and extend across a portion of a length between the source region and said drain region.

10. The integrated circuit of claim 9, wherein doping of the body region extends along a sidewall of a gate trench formed into at least one of the plurality of field dielectric portions in a direction between the source region and the drain region.

11. The integrated circuit of claim 9, wherein the gate electrode extends over or into a portion of at least one of the plurality of field dielectric portions.

12. The integrated circuit of claim 9, further comprising at least one field plate over or into a portion of at least one of the plurality of field dielectric portions, the at least one field plate spaced apart from the gate electrode.

13. The integrated circuit of claim 9, wherein the gate electrode extends over or into a portion of at least one of the plurality of field dielectric portions, and further comprising at least one field plate over or into a portion of at least one of the plurality of field dielectric portions, wherein the at least one field plate is spaced apart from the gate electrode.

14. The integrated circuit of claim 1, wherein the DEMOS transistor comprises a power switch, the power switch operable for switching or driving a resistive, capacitive or inductive load.

15. The integrated circuit of claim 14, wherein the integrated circuit comprises a voltage regulator, the regulator comprising a serial connection of a controller, at least one power driver and at least one power switch, wherein at least one of the power driver or the power switch comprises the DEMOS transistor.

16. An integrated circuit including a drain extended metal-oxide-semiconductor (DEMOS) transistor, comprising:
    a substrate having a semiconductor surface layer, the surface layer having a top surface;
    a drift region in the surface layer having a first dopant type;
    an shallow trench isolation field oxide region in a portion of the surface layer;
    a body region of a second dopant type within the drift region, the body region having a body wall extending from the top surface of the surface layer downwards along at least a portion of a dielectric wall of the shallow trench isolation field oxide region;
    a gate dielectric on at least a portion of the body wall;
    a gate electrode on the gate dielectric on the body wall;
    a source region of the first dopant type in the body region;
    a drain region of the first dopant type in the drift region.

17. The integrated circuit of claim 16, wherein the shallow trench isolation field oxide region includes:
    a plurality of dielectric portions that are separated from each other and extend across a portion of a length between the source region and the drain region; and
    wherein the gate electrode or another electrode has one or more portions extending over individual ones of the plurality of dielectric portions.

18. An integrated circuit including a drain extended metal-oxide-semiconductor (DEMOS) transistor, comprising:
    a substrate having a semiconductor surface;
    a drift region of first dopant type formed in the surface;
    a field dielectric formed in a portion of the drift region;
    a body region of second dopant type formed in the drift region;
    a gate electrode having a portion formed with a vertical component depending into the drift region between the body region and the field dielectric;
    a gate dielectric having a portion formed with a vertical component depending into the drift region between the vertical component of the gate electrode and the body region;

a source region of the first dopant type formed in the body region proximate a side facing the body region of the vertical component of the gate dielectric;

a drain region of the first dopant type formed in the surface proximate a side of the field dielectric opposite the vertical component of the gate electrode and in electrical communication with the drift region;

whereby a channel region is defined in the body region with a vertical component corresponding to at least a portion of the vertical components of the gate dielectric and gate electrode between the source region and a part of the drift region located below the body region.

19. The integrated circuit of claim 18, wherein the gate dielectric is formed to depend into a cavity formed in the surface, with at least a portion of the cavity having an interface with the field dielectric and at least another portion of the cavity having an interface with the body region; and wherein the gate electrode is formed to depend into the cavity over the gate dielectric.

20. The integrated circuit of claim 19, wherein the gate dielectric includes a portion extending over the surface, laterally between the cavity and the source region; and the gate electrode includes a portion extending over the portion of the gate dielectric extending over the surface.

21. The integrated circuit of claim 19, wherein at least a portion of the cavity has an interface with the source region.

22. The integrated circuit of claim 19, wherein the at least another portion of the cavity having an interface with the body region includes both a side portion and a bottom portion of the cavity.

23. The integrated circuit of claim 19, wherein the gate electrode also includes a portion extending laterally over the field dielectric between the cavity and the drain region.

24. The integrated circuit of claim 19, wherein the gate electrode is coplanar with a top surface of the field dielectric.

* * * * *